(12) United States Patent
Ohtsuki et al.

(10) Patent No.: US 7,581,961 B2
(45) Date of Patent: Sep. 1, 2009

(54) METHOD FOR PREVENTING SOLDER RISE TO ELECTRIC CONTACT AND ELECTRIC CONTACT PRODUCED BY THE SAME

(75) Inventors: Tomonari Ohtsuki, Tokyo (JP); Katsuya Yamagami, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/889,173

(22) Filed: Aug. 9, 2007

(65) Prior Publication Data
US 2008/0070014 A1  Mar. 20, 2008

(30) Foreign Application Priority Data
Sep. 15, 2006  (JP)  ............... 2006-250193

(51) Int. Cl.
*H01R 12/00* (2006.01)
(52) U.S. Cl. ............. 439/70; 439/88; 439/131; 29/843; 29/860; 29/877; 228/46; 228/200
(58) Field of Classification Search ............ 439/83, 439/131, 70–72; 29/843, 860, 877; 228/46, 228/200
See application file for complete search history.

(56) References Cited

U.S. PATENT DOCUMENTS 4,728,302 A * 3/1988 Wozniczka ............ 439/620.24
5,177,326 A * 1/1993 Goldhammer ............ 174/555
5,736,790 A   4/1998 Iyogi et al.
6,780,028 B1 * 8/2004 Kennedy et al. ............ 439/83
6,851,598 B2 * 2/2005 Gebauer et al. ........ 228/180.22
7,186,119 B2 * 3/2007 Perugini ..................... 439/66
7,347,750 B2 * 3/2008 Cachina et al. ............ 439/876
2006/0057902 A1 * 3/2006 Seidler et al. ............. 439/874

FOREIGN PATENT DOCUMENTS

JP   2003-046250   2/2003
KR   1997-18463    4/1997

OTHER PUBLICATIONS

Korean Office Action dated Nov. 20, 2008 (3 pages).

* cited by examiner

*Primary Examiner*—Truc T Nguyen
(74) *Attorney, Agent, or Firm*—Dickstein Shapiro LLP

(57) ABSTRACT

Method for preventing solder from rising to a portion of an electric contact when the electric contact is being soldered to a copper foil so as to extend therefrom. The portion is plated with a noble metal and adapted to contact a mating object. Cooling means is brought into contact with at least the portion of the electric contact adapted to contact the mating object, and connection portion between the electric contact and the copper foil is heated by heating means. The rising of solder can be prevented and the electric contacts thus obtained are superior in mechanical property (sufficient bonding strength), electrical property (conductive property and low contact resistance), resistance to environmental conditions (impediment to oxidization), and physical property (limitation of rise of solder due to capillary action).

8 Claims, 6 Drawing Sheets

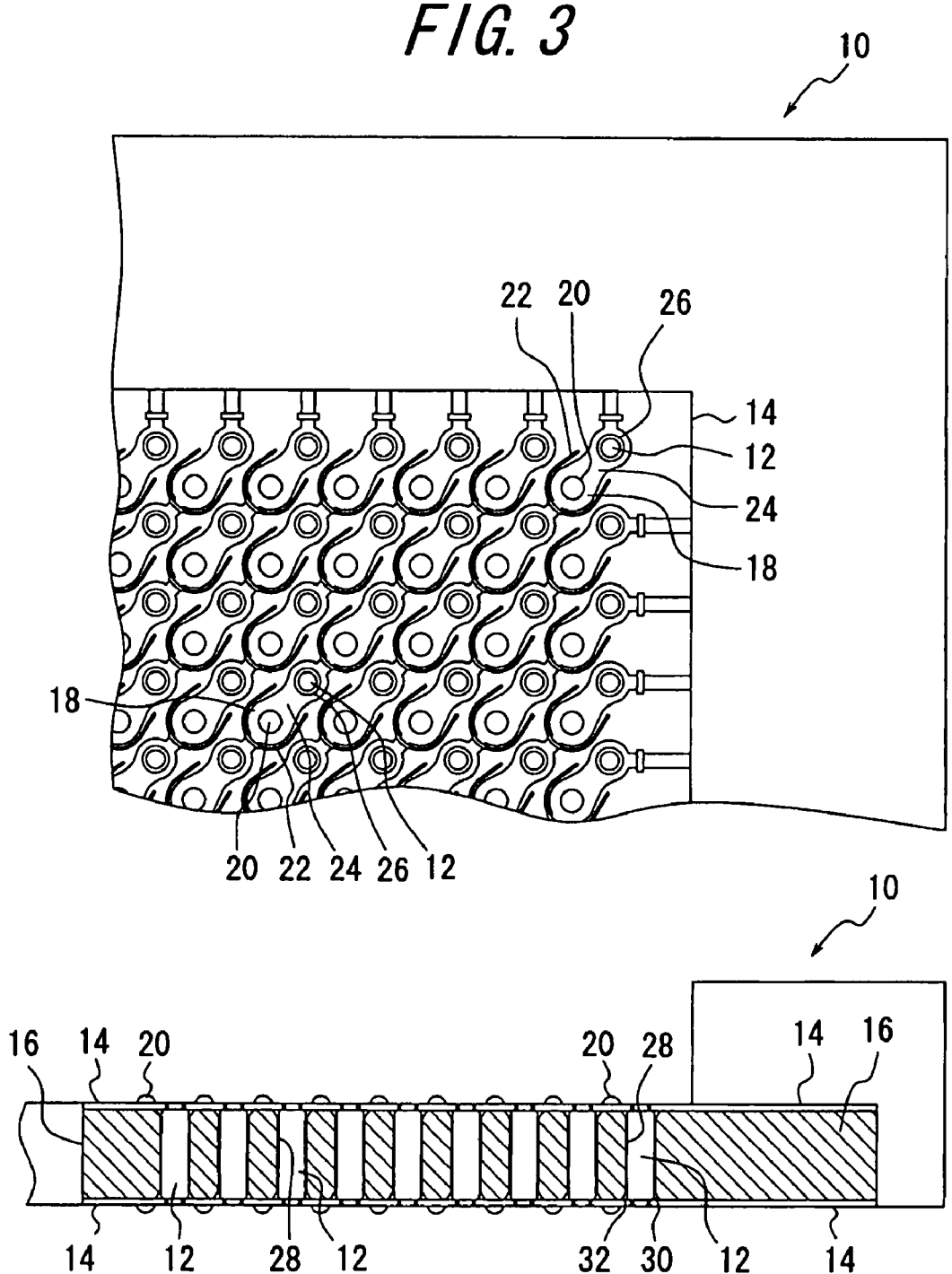

METHOD FOR PREVENTING SOLDER RISE TO ELECTRIC CONTACT AND ELECTRIC CONTACT PRODUCED BY THE SAME

BACKGROUND OF THE INVENTION

This invention relates to a method for preventing solder from rising to a portion of an electric contact adapted to contact a mating object in producing the electric contact formed on a copper foil so as to extend therefrom by connecting the electric contact to the copper foil by soldering with enough bonding strength, and more particularly to an electric contact produced by the use of the method.

The word "rising" or "rise" as used herein is to be understood to mean a phenomenon that in soldering process, melted solder climbs up with the aid of the capillary action to an area where existence of the solder is unfavorable.

In order to bring a circuit board into contact with an electronic part, hitherto, if contact portions of the one part are flat, contact portions of the other part are frequently formed in extending shapes (for example, a hemisphere). As examples of such electric contacts, incorporated herein are Japanese Patent Application No. 2005-277,320 (Patent Literature 1) and Japanese Patent Application No. 2005-344,971 (Patent Literature 2) using metal balls, filed by the applicant of the present application.

Patent Literature 1

According to the abstract of the Japanese Patent Application No. 2005-277,320, the invention has an object to provide electric contacts and a method for producing the electric contacts having a predetermined height without causing defective connection between the electric contacts. Disclosed is an electric contact extending from a copper foil in which the copper foil is coated with a metal paste layer, and a metal ball is fixed to the copper foil by sintering the metal paste layer and is plated with gold over at least part adapted to contact a mating object. Further, disclosed is a method for producing an electric contact extending from a copper foil including steps of coating the copper foil with a metal paste layer over a predetermined area as a first step, arranging a metal ball on the metal paste layer and thereafter pushing the metal ball against the copper foil as a second step, fixing the metal ball to the copper foil by sintering the metal paste layer at a predetermined temperature as a third step, and plating the metal ball with gold over at least part adapted to contact a mating object as a fourth step.

Patent Literature 2

According to the abstract of the Japanese Patent Application No. 2005-344,971, this invention has an object to provide electric contact and a method for producing the electric contacts which have a predetermined height without any risk of defective or failed connection between the electric contacts. Disclosed is an electric contact extending from a copper foil, comprising a metal ball fixed to the copper foil by sintering a metal paste layer coated on the copper foil, the metal ball having a contact portion adapted to contact a mating object and plated with gold. Further disclosed is a method for producing an electric contact extending from a copper foil, comprising steps of coating a metal paste layer of a predetermined area on a copper foil as a first step, loading a metal ball on the metal paste layer and then pushing the metal ball to the copper foil as a second step, fixing the metal ball to the copper foil by sintering the metal paste layer at a predetermined temperature as a third step, and plating at least the contact portion of the metal ball adapted to contact a mating object with a noble metal as a fourth step.

In recent years, with the miniaturization of electric and electronic appliances, electrical connectors have been miniaturized and their pitches have become narrower. It is desirable to produce electric contacts on a copper foil using the metal balls disclosed in the Patent Literatures 1 and 2, from the standpoint of the narrower pitches and reduced overall height. It is needed to fix a metal ball to a copper foil by the use of an electrically conductive adhesive in order to install the surface-treated metal ball as an electric contact on the copper foil. Copper paste, silver paste and solder paste are generally used as the electrically conductive adhesive, while the electric contact is required to have a bonding strength as a mechanical property. By comparison, when metal balls having a diameter of 300 µm are bonded to a copper foil, laterally pulling-out strengths are 80 to 130 grf for copper paste, 120 to 190 grf for silver paste, and 300 to 500 grf for solder (Sn3Ag0.5Cu) paste. The solder paste is the best as to the bonding strength.

Moreover, the electric contacts are required to have superior electrical conductivity and low contact resistance as electrical properties. Needless to say, the bonded portions of the electric contacts are also required to have electrical conductivity and low contact resistance as electrical properties. By comparison, resistances are 50 µΩcm for copper paste, 40 µΩcm for silver paste, and 11 µΩcm for solder paste. The solder paste is the best as to the resistance.

Furthermore, as to resistance to environmental conditions, all the copper paste, silver paste and solder paste used as conductive adhesives are likely to be oxidized or sulfurized so that they are not suitable for contact portions adapted to contact mating objects, and stable connections with low contact resistance could not be obtained.

Moreover, as to rising or spreading of these pastes due to capillary action when fixing a metal ball by heating, there are significant differences between the copper paste or silver paste from the solder paste. The copper paste or the silver paste is made by kneading fine metal powder into epoxy family resin and solidified by heating. When being solidified, they do not rise or spread beyond the coated or printed regions. In contrast herewith, the solder paste is made by kneading powder of tin (Sn)-based alloy into a flux as a reducing activator. Before the solder arrives at its melting temperature, the flux starts to melt and spread due to capillary action so that the metal surface to be bonded by soldering is activated, with the result that the metal surface arrives a temperature sufficient to melt the solder. The rise of the solder with the capillary action would spread to the range whose angle is less than the contact angle. In other words, with the solder paste, the solder will rise to the contact portion of an electric contact adapted to contact a mating object and the raised solder reacts with the ambient air so as to be oxidized, whereby a stable connection with low contact resistance could not be obtained.

SUMMARY OF THE INVENTION

In view of the problems of the prior art described above, the invention has an object to provide a method for preventing solder from rising in producing electric contacts and to provide electric contacts produced by using the method, which are superior in mechanical property (sufficient bonding strength), electrical property (conductive property and low contact resistance), resistance to environmental conditions (impediment to oxidization), and physical property (limitation of rise of solder due to capillary action).

The object of the invention is accomplished by the method for preventing solder from rising to a portion 47 of an electric contact 20 when said electric contact 20 is being soldered to a copper foil 40 so as to extend therefrom, said portion 47 being plated with a noble metal 46 and adapted to contact a mating object, wherein cooling means is brought into contact with at least said portion 47 of the electric contact 20 adapted to contact said mating object, and connection portion between said electric contact 20 and said copper foil 40 is heated by heating means.

In the method for preventing solder from rising as defined in claim 2, a shape of part of said cooling means to contact said portion 47 of the electric contact 20 adapted to contact said mating object is concave 52 to be commensurate with said portion 47 of the electric contact 20.

In the method for preventing solder from rising as defined in claim 3, a U-shaped slit 22 is provided at position surrounding said electric contact 20.

In the method for preventing solder from rising as defined in claim 4, part in continuity with said electric contact through said copper foil 40 is heated by said heating means to connect said copper foil 40 and said electric contact 20.

In the method for preventing solder from rising as defined in claim 5, a heat sink 48 is used as said cooling means, and laser beam 50 is used as said heating means.

In the method for preventing solder from rising as defined in claim 6, said heat sink 48 is formed with a through-hole 54 at location corresponding to part to be heated, and said laser beam 50 or the object to be heated is moved so as to heat said part through said through-hole 54.

The electric contact 20 defined in claim 7 connected to a copper foil 40 by soldering so as to extend therefrom and having a portion 47 plated with a noble metal 46 and adapted to contact a mating object, in which said electric contact 20 is soldered to said copper foil 40 in a manner that said portion 47 of said electric contact 20 adapted to contact the mating object is cooled by cooling means in contact with at least said portion 47 of the electric contact 20, while a connection portion between said electric contact 20 and said copper foil 40 is heated by heating means, and a U-shaped slit 22 is provided at position surrounding said electric contact 20.

The electric contact 20 defined in claim 8 connected to a copper foil 40 by soldering so as to extend therefrom and having a portion 47 plated with a noble metal 46 and adapted to contact a mating object, in which said electric contact 20 is soldered to said copper foil 40 in a manner that said portion 47 of said electric contact 20 adapted to contact the mating object is cooled by cooling means in contact with at least said portion 47 of the electric contact 20, while a connection portion between said electric contact 20 and said copper foil 40 is heated by heating means, a shape of part of said cooling means to contact said portion 47 of said electric contact 50 adapted to contact the mating object is concave 52 to be commensurate with said portion 47 of said electric contact 20.

As can be seen from the description described above, the method for preventing solder from rising in producing electric contacts and the electric contacts produced by the use of the method can bring about the following significant functions and effect.

(1) The method for preventing solder from rising to a portion 47 of an electric contact 20 when said electric contact 20 is being soldered to a copper foil 40 so as to extend therefrom, said portion 47 being plated with a noble metal 46 and adapted to contact a mating object, according to the invention cooling means is brought into contact with at least said portion 47 of the electric contact 20 adapted to contact said mating object, and connection portion between said electric contact 20 and said copper foil 40 is heated by heating means. Consequently, the solder is prevented from rising to the contact portion 47 of the electric contact adapted to contact a mating object, and electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(2) In the method for preventing solder from rising as defined in claim 2, a shape of part of said cooling means to contact said portion 47 of the electric contact 20 adapted to contact said mating object is concave 52 to be commensurate with said portion 47 of the electric contact 20. Therefore, the solder is securely prevented from rising to the contact portion 47 of the electric contact adapted to contact a mating object, and electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(3) In the method for preventing solder from rising as defined in claim 3, a U-shaped slit 22 is provided at position surrounding said electric contact 20. Accordingly, even if there are differences in height of electric contacts 20, all the electric contacts can be securely brought into contact with the cooling means, and the solder 421 is prevented from rising to the contact portion 47 of the electric contact adapted to contact a mating object so that electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(4) In the method for preventing solder from rising as defined in claim 4, part in continuity with said electric contact through said copper foil 40 is heated by said heating means to connect said copper foil 40 and said electric contact 20. Therefore, the solder is prevented from rising to the contact portion of the electric contact adapted to contact a mating object, and electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(5) In the method for preventing solder from rising as defined in claim 5, a heat sink 48 is used as said cooling means, and laser beam 50 is used as said heating means. Accordingly, the solder 421 is prevented from rising to the contact portion 47 of the electric contact adapted to contact a mating object, and electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(6) In the method for preventing solder from rising as defined in claim 6, said heat sink 48 is formed with a through-hole 54 al location corresponding to part to be heated, and said laser beam 50 or the object to be heated is moved so as to heat said part through said through-hole 54. Therefore, the solder paste 42 at the bonding portion can be securely melted, and the metal ball 44 can be fixed to the copper foil. The solder 421 is prevented from rising to the contact portion 47 of the electric contact adapted to contact a mating object so that electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(7) The electric contact 20 defined in claim 7 connected to a copper foil 40 by soldering so as to extend therefrom and having a portion 47 plated with a noble metal 46 and adapted to contact a mating object, in which said electric contact 20 is soldered to said copper foil 40 in a manner that said portion 47 of said electric contact 20 adapted to contact the mating object is cooled by cooling means in contact with at least said portion 47 of the electric contact 20, while a connection portion between said electric contact 20 and said copper foil 40 is heated by heating means, and a U-shaped slit 22 is provided at position surrounding said electric contact. Accordingly, even if there are differences in height of electric contacts 20, all the electric contacts can be securely brought into contact with the cooling means, and the solder 421 is prevented from rising to the contact portion 47 of the electric contact adapted to contact a mating object so that electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

(8) An electric contact 20 defined in claim 8 connected to a copper foil 40 by soldering so as to extend therefrom and having a portion 47 plated with a noble metal 46 and adapted to contact a mating object, in which said electric contact 20 is soldered to said copper foil 40 in a manner that said portion 47 of said electric contact 20 adapted to contact the mating object is cooled by cooling means in contact with at least said portion 47 of the electric contact 20, while a connection portion between said electric contact 20 and said copper foil 40 is heated by heating means, and a shape of part of said cooling means to contact said portion 47 of said electric contact 50 adapted to contact the mating object is concave 52 to be commensurate with said portion 47 of said electric contact 20. Accordingly, the solder 421 is securely prevented from rising to the contact portion 47 of the electric contact adapted to contact a mating object, and electric contacts obtained using the method are superior in mechanical property (sufficient bonding strength), electrical property (conductive property and low contact resistance), resistance to environmental conditions (impediment to oxidization), and physical property (limitation of rise of solder due to capillary action).

The invention will be more fully understood by referring to the following detailed specification and claims taken in connection with the appended drawings.

BRIEF DESCRIPTION OF THE DRAWINGS

FIG. 3 includes a partly plan and a partly longitudinal-sectional view of the electrical connector;

DESCRIPTION OF THE PREFERRED EMBODIMENTS

The solder rise preventing method and the electric contact 20 produced by using the method according to the invention will be explained with reference to FIGS. 1A to 5D. In the illustrated embodiment, an electrical connector 10 using said electric contacts 20 will be explained.

Figure 1A:
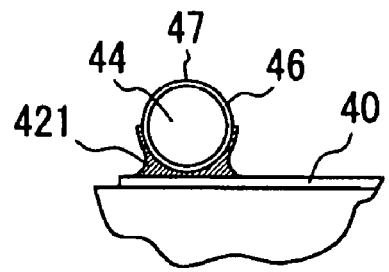
FIG. 1A is a sectional view of an electric contact soldered to a copper foil.
Figure 1B:
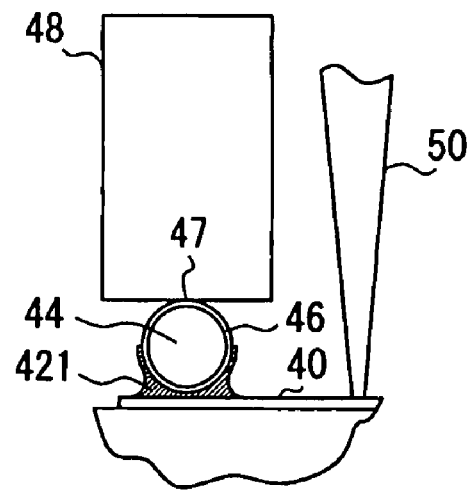
FIG. 1B is a sectional view of the electric contact in contact with a heat sink as cooling means and laser beam irradiating the part to be heated.
Figure 1C:
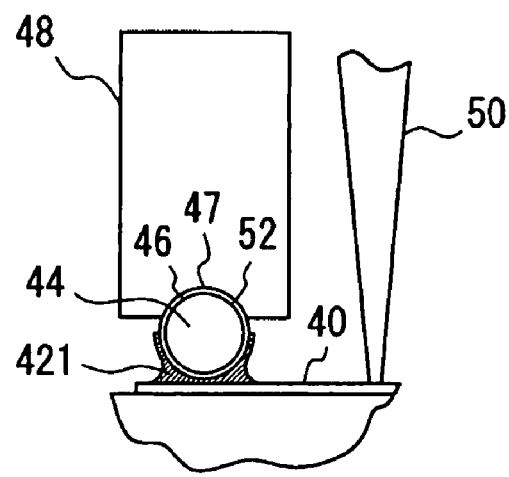
FIG. 1C is a sectional view of an electric contact in contact with another heat sink and laser beam irradiating the part to be heated.
Figure 2:
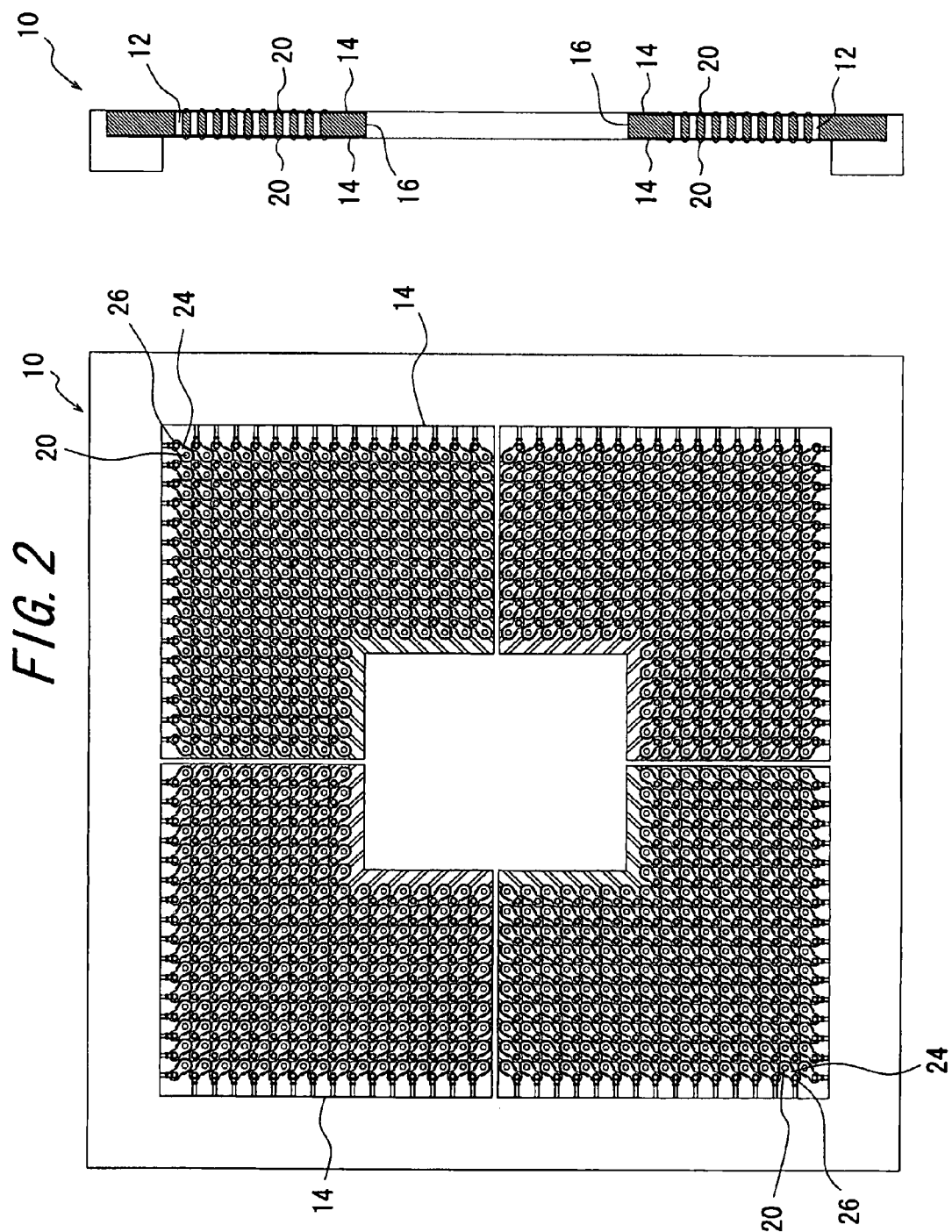
FIG. 2 includes a plan and a longitudinal-sectional view of an electrical connector.

FIG. 1A is a sectional view of an electric contact after being soldered, and FIG. 1B is a sectional view illustrating that a heat sink as cooling means is in contact with an electric contact and its part to be heated is irradiated with laser beam, while FIG. 1C is a sectional view illustrating that another sink is in contact with an electric contact and its part to be heated is irradiated with laser beam. FIG. 2 includes a plan view and a longitudinal-sectional view of an electrical connector. FIG. 3 includes a partly enlarged plan view and a partly enlarged longitudinal-sectional view of the electrical connector. FIGS. 4A to 4D are views for explaining the method for producing an electric contact according to the invention. FIGS. 5A to 5D are views for explaining another method for producing an electric contact according to the invention in which a heat sink commensurate in shape with the electric contact is used and laser beam irradiates through a through-hole of the heat sink. FIG. 6 is a view for explaining a temperature gradient of an electric contact according to the invention.

The electrical connector 10 of one embodiment of the invention at least comprises an elastomer, fine conductors 12, and flexible printed circuit boards 14.

First of all, the construction of an electric contact 20 after being soldered will be explained. Said electric contact 20 constructed in a manner that a metal ball 44 plated with a noble metal 46 is arranged on solder paste 42 on a copper foil 40, and the soldering paste 42 is then melted to cause said metal ball 44 and said copper foil 40 to be in electrical continuity with each other. When the solder paste 42 is melted, the soldering is effected so as not to allow the melted solder 421 to rise due to the capillary action to the contact portion 47 of said metal ball 44 adapted to contact a mating object. The material of said metal ball 44 is suitably selected in consideration of electric conductivity and surface treatment, and copper alloys are preferable for the metal ball. The size of said metal ball 44 may be suitably designed in consideration of a peripheral space and a required electric contact height.

The method will be explained for preventing melted solder 421 from rising due to the capillary action to the contact portion 47 of the metal ball adapted to contact a mating object when said solder paste is melting. As shown in FIG. 1B, cooling means (for example, a heat sink 48) is brought into contact with the contact portion 47 of said metal ball 44 adapted to contact the mating object, and under such a condition, said copper foil 40 is heated by heating means (for example, laser beam 50) without directly heating the solder paste 421 by means of said heating means, thereby melting said solder paste 42 and hence soldering said metal ball 44 onto said copper foil 40.

In order to ensure the cooling effect of the cooling means and to achieve the reliable contact with the cooling means, said cooling means (for example, heat sink 48) is formed to be commensurate in shape with the contact portion 47 of said metal ball 44 as shown in FIG. 1C. For example, the heat sink 48 is formed with a recess 52.

A temperature gradient in the electric contact 20 when soldering will be explained herein with reference to FIG. 6. In order to melt the solder paste 42, the temperature of the part to be soldered must be 220° C. to 230° C. However, since said electric contact 20 is 0.3 mm in diameter which is very small, when the temperature of the solder paste 42 arrives at 220° C. to 230° C., the temperature of the entire electric contact 20 will be also 220° C. to 230° C. so that the solder 421 rises due to the capillary action to the contact portion 47 adapted to contact the mating object. In order to prevent the solder 421 from rising to the contact portion 47, therefore, a temperature gradient (temperature difference) is caused in the electric contact 20 according to the invention. In other words, the contact portion 47 of said electric contact 20 adapted to contact the mating object is cooled by bringing the heat sink 48 as cooling means into contact with the contact portion 47, and said copper foil 40 is heated at a location spaced apart from said solder paste 42 by the laser beam 50 as the heating means without directly heating said solder paste 42. As a result, in the case that a point E 64 of the copper foil 40 is heated at 250° C., a temperature gradient (temperature difference) is obtained in a manner that temperatures at points D 62, C 60, B 58 and A 56 are 230° C., 220° C., 210° C. and 200° C., respectively. The boundary temperature of solder melting lies between the temperatures at points B 58 and C 60.

The flexible printed circuit board 14 will then be explained. Said flexible printed circuit board 14 is provided with a plurality of electric contact elements 18 at locations corresponding to contacts of a mating connector. The electric contact elements 18 are each provided with a hemispherical electric contact 20 so as to be most commensurate with the mating contact to facilitate contacting the mating contact. Said flexible printed circuit board 14 is provided at its center portion with a recess or a through-groove (through-hole) at a position corresponding to capacitors, integrated circuit chips, resistors and the like extending higher than the contacts of the mating connector in order to avoid the printed circuit board from contacting these capacitors, integrated circuit chips, resistors and the like. The size of the recess or through-groove need only serve to prevent the circuit board from contacting the capacitors, integrated circuit chips, resistors and the like extending higher than the contacts of the mating connector and may be suitably designed in consideration of the miniaturization of the connector and positional accuracy and the like.

The flexible printed circuit board 14 is formed with substantially U-shaped slits 22 each around the electric contact element 18. By providing the U-shaped slit 22 at position surrounding the electric control element 18, the electric contact element 18 is elastically supported by a cantilever surrounded by the U-shaped slit 22 so that upon contacting a mating contact of the connector, the electric contact element 18 is deformed by the mating contact, with the result that the mating contact slides on the electric contact element 18. The size of the slits 22 may be suitably designed in consideration of such a function, the miniaturization of the connector 10, and the like. Said electric contact element 18 is connected through its conductive portion 24 to the through-hole 26 which is in turn connected to a fine conductor 12 as shown in FIG. 3. The size of said through-holes 26 need only receive said fine conductors 12 and be able to connect the fine conductors 12 by soldering, and may be suitably designed in consideration of the miniaturization of the connector 10 and strength and connectivity of the fine conductors 12.

The fine conductors 12 will then be explained. The fine conductors 12 are substantially circular cylindrical and have a larger diameter at their center portion and a smaller diameter at both end portions to have two shoulders. Said fine conductors are made of a metal, and a metal superior in conductive characteristics, for example, a brass bar is cut into a predetermined size and further worked at both the end portions to a smaller diameter. Both the end portions are inserted in the through-holes 26 of the flexible printed circuit boards. The diameters of both the end portions of the fine conductors 12 may be suitably designed so as to be inserted in said through-holes 26 and to be connected thereto by soldering. The center portions of the fine conductors 12 are embedded in the elastomer 16. The diameter of the center portions may be suitably designed in consideration of the miniaturization and narrower pitches of the connector 10 and conductivity of the fine conductors. The lengths of the respective parts of the fine conductors may be suitably designed in consideration of thicknesses of the flexible printed circuit boards 14 and the elastomer 16.

The elastomer 16 will then be explained. Said elastomer 16 is formed with inserting holes 28 for inserting said fine conductors 12, respectively. The size of the inserting holes 28 need only be able to receive said fine conductors 12 and may be suitably designed in consideration of holding force for the fine conductors and the like. In the illustrated embodiment, the diameter of the inserting holes 28 is approximately 20 μm smaller than the diameter of the center portions of the fine conductors 12. The elastomer 16 is preferably formed with a recess 32 at each of the ends of the inserting holes 28 for preventing warp of part of the elastomer 16 onto a shoulder of the fine conductor 12. The elastomer 16 is formed from silicon rubber or fluororubber.

Finally, the methods for producing the electric contacts 20 according to the invention will be explained with reference to FIGS. 4A to 4D and FIGS. 5A to 5D.

Figure 4A:
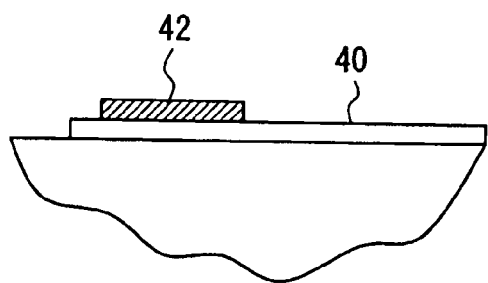
FIGS. 4A, 4B, 4C and 4D are views for explaining the method for producing the electric contact according to the invention.

The method shown in FIGS. 4A to 4D will be explained. As a first step, a copper foil 40 is coated with a solder paste layer 42 of a predetermined area as shown in FIG. 4A.

Figure 4B:
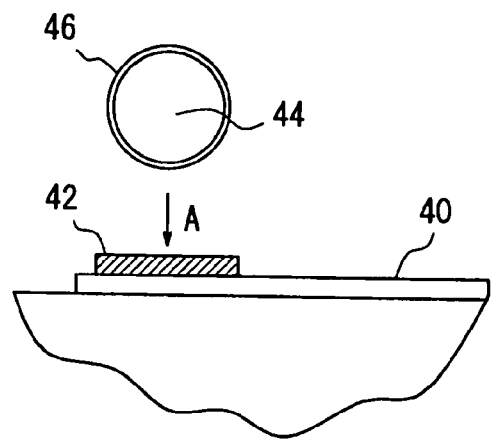

As a second step, a metal ball 44 plated with a noble metal 46 is loaded on said solder paste layer 42 in the direction shown by an arrow A in FIG. 4B.

Figure 4C:
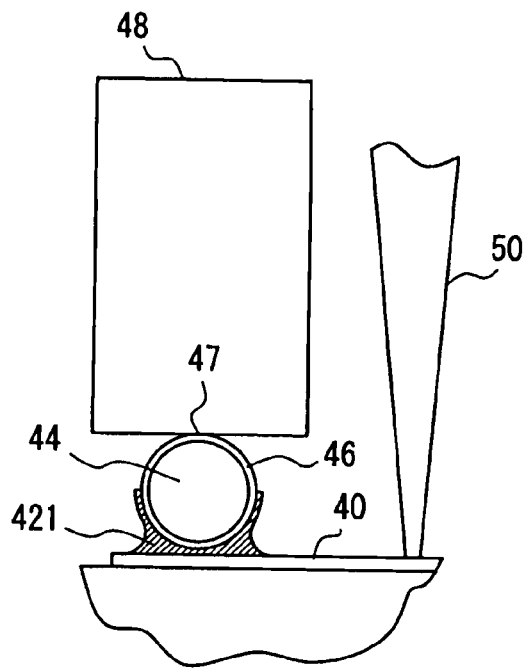
Figure 4D:
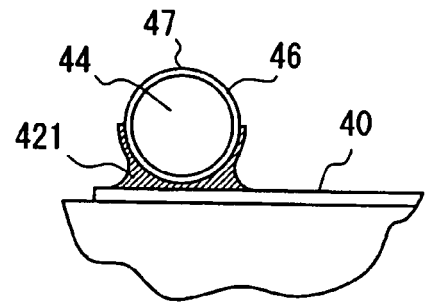

As a third step, a heat sink 48 as cooling means is brought into contact with the contact portion 47 of said metal ball 44 as shown in FIG. 4C. Although the heat sink having the flat surface to contact the metal ball is used in FIG. 4C, a heat sink having a recess 52 commensurate with the shape of the contact portion 47 of the metal ball 44 may be used as shown in FIG. 1C.

As a fourth step, under the condition that the heat sink 48 is in contact with the metal ball 44, said copper foil 40 is heated by laser beam 50 as heating means to melt said solder paste 42 as shown in FIG. 4C so that said metal ball 44 is soldered to the copper foil 40. Since there is the temperature gradient (temperature difference) in the electric contact 20 as described above, the molten solder 421 does not rise due to capillary action to the contact portion 47 of said metal ball 44.

Figure 5A:
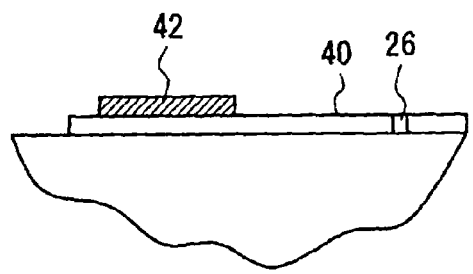
FIGS. 5A, 5B, 5C and 5D are views for explaining another method for producing an electric contact according to the invention with a heat sink commensurate in shape with the electric contact and laser beam irradiating through a through-hole of the heat sink.

The method shown in FIGS. 5A to 5D will then be explained. As a first step, a copper foil 40 is coated with a solder paste layer 42 of a predetermined area as shown in FIG. 5A.

Figure 5B:
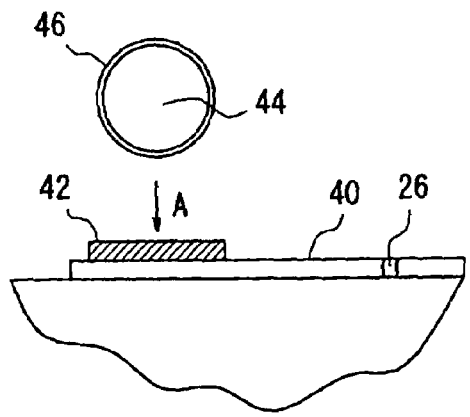
Figure 6:
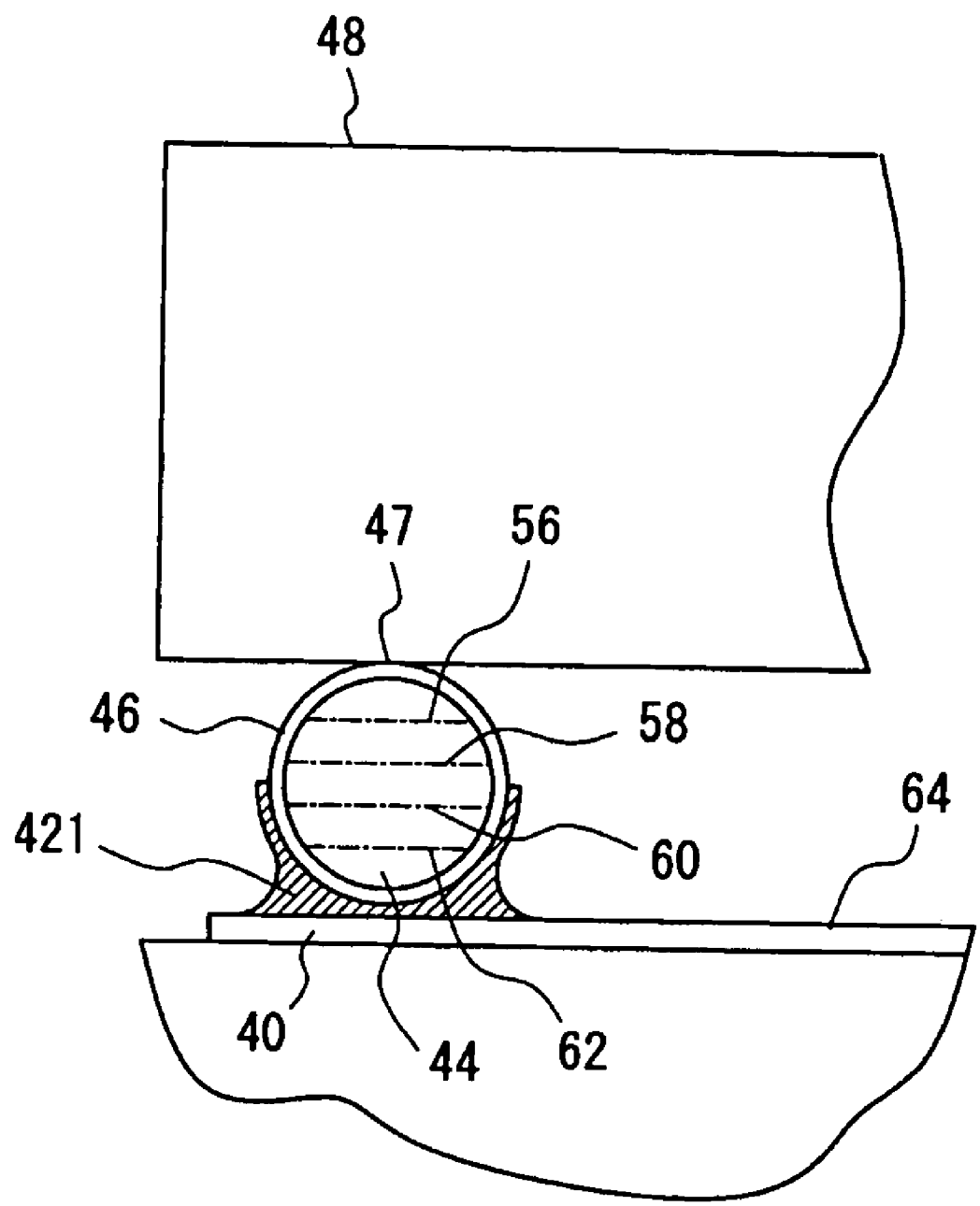
FIG. 6 is a view for explaining a temperature gradient in an electric contact according to the invention.

As a second step, a metal ball 44 plated with a noble metal 46 is loaded on said solder paste layer 42 in the direction shown by an arrow A in FIG. 5B.

Figure 5C:
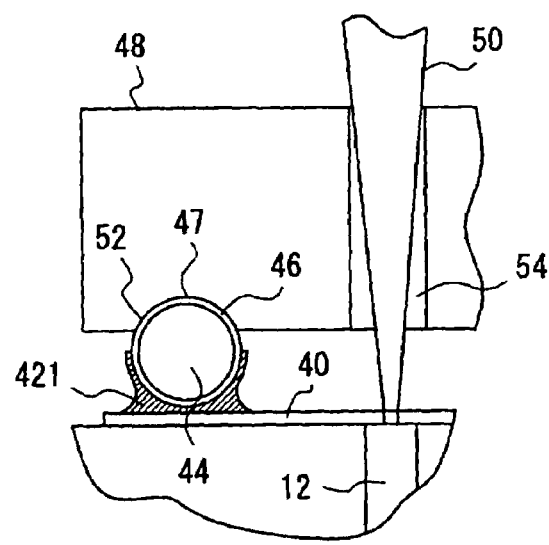
Figure 5D:
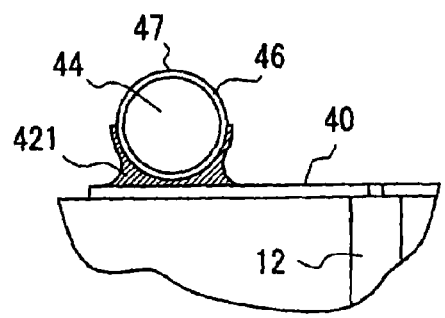

As a third step, a heat sink 48 (having a recess 52 commensurate with the shape of the contact portion 47 of the metal ball 44) as cooling means is brought into contact with the contact portion 47 of said metal ball 44 as shown in FIG. 5C.

As a fourth step, under the condition that the heat sink 48 is in contact with the metal ball 44, a land about the through-hole 26 is heated by laser beam 50 as heating means through a through-hole 54 formed in the heat sink 48 to melt the solder paste 42 as shown in FIG. 5C so that said metal ball 44 is soldered to the copper foil 40. Since there is the temperature gradient (temperature difference) in the electric contact 20 as described above, the molten solder 421 does not rise due to capillary action to the contact portion 47 of said metal ball 44, and simultaneously the fine conductors 12 are soldered to the flexible printed circuit board 14.

Examples of applications of the invention are electrical connectors fitted between circuit boards and electronic parts, and particularly in producing a number of electric contacts 20 formed on a copper foil in a manner extending therefrom, the solder rising-preventing method for preventing the solder from rising due to capillary action to the contact portions 47 of the electric contacts 20 while maintaining sufficient bonding strength of the electric contacts to the copper foil.

While the invention has been particularly shown and described with reference to the preferred embodiments thereof, it will be understood by those skilled in the art that the foregoing and other changes in form and details can be made therein without departing from the spirit and scope of the invention.

What is claimed is:

1. An electric contact connected to a copper foil by soldering so as to extend therefrom and having a portion plated with a noble metal and adapted to contact a mating object,
    wherein said electric contact is soldered to said copper foil in a manner that said portion of said electric contact adapted to contact the mating object is cooled by cooling means in contact with at least said portion of the electric contact, while a connection portion between said electric contact and said copper foil is heated by heating means, and a U-shaped slit is provided at position surrounding said electric contact.

2. An electric contact connected to a copper foil by soldering so as to extend therefrom and having a portion plated with a noble metal and adapted to contact a mating object, herein said electric contact is Soldered to said copper foil in a manner that said portion of said electric contact adapted to contact the mating object is cooled by cooling means in contact with at least said portion of the electric contact, while a connection portion between said electric contact and said copper foil is heated by heating means, and a shape of part of said cooling means to contact said portion of said electric contact adapted to contact the mating object is concave to be commensurate with said portion of said electric contact.

3. A method for preventing solder from rising to a portion of an electric contact when said electric contact is being soldered to a copper foil so as to extend therefrom, said portion being plated with a noble metal and adapted to contact a mating object, wherein cooling means is brought into contact with at least said portion of the electric contact adapted to contact said mating object, and connection portion between said electric contact and said copper foil is heated by heating means.

4. The method for preventing solder from rising as set forth in claim 3, wherein a shape of part of said cooling means to contact said portion of the electric contact adapted to contact said mating object is concave to be commensurate with said portion of the electric contact.

5. The method for preventing solder from rising as set forth in claims 3 or 4, wherein a U-shaped slit is provided at position surrounding said electric contact.

6. The method for preventing solder from rising as set forth in claims 3 or 4, wherein part in continuity with said electric contact through said copper foil is heated by said heating means to connect said copper foil and said electric contact.

7. The method for preventing solder from rising as set forth in claims 3 or 4, wherein a heat sink is used as said cooling means, and laser beam is used as said heating means.

8. The method for preventing solder from rising as set forth in claim 7, wherein said heat sink is formed with a through-hole at location corresponding to part to be heated, and said laser beam or the object to be heated is moved so as to heat said part through said through-hole.

* * * * *